United States Patent
Holland et al.

(10) Patent No.: US 7,438,534 B2
(45) Date of Patent: Oct. 21, 2008

(54) WIDE RANGE PRESSURE CONTROL USING TURBO PUMP

(75) Inventors: Peter John Holland, Pleasanton, CA (US); Kate Wilson, Mountain View, CA (US); Dawn Stephenson, San Jose, CA (US)

(73) Assignee: Edwards Vacuum, Inc., Wilmington, WA (US)

( * ) Notice: Subject to any disclaimer, the term of this patent is extended or adjusted under 35 U.S.C. 154(b) by 251 days.

(21) Appl. No.: 11/245,797

(22) Filed: Oct. 7, 2005

(65) Prior Publication Data

US 2007/0079758 A1   Apr. 12, 2007

(51) Int. Cl.
*F04B 49/00*   (2006.01)
*F04B 17/00*   (2006.01)
*F04B 35/04*   (2006.01)

(52) U.S. Cl. .......... 417/26; 417/423.4; 417/423.1
(58) Field of Classification Search .......... 417/26, 417/423.4, 423.1
See application file for complete search history.

(56) References Cited

U.S. PATENT DOCUMENTS 5,443,368 A   8/1995   Weeks et al.
6,200,107 B1 *   3/2001   Brewster .................. 417/251
6,598,615 B1   7/2003   Holland et al.
6,869,880 B2 *   3/2005   Krishnaraj et al. .......... 438/689
7,140,847 B2 *   11/2006   Boger et al. .................. 417/296
2001/0032613 A1 *   10/2001   Arai et al. .................. 123/399

OTHER PUBLICATIONS

PCT Notification of Transmittal of the International Search Report and the Written Opinion of the International Searching Authority, or the Declaration of International Application No. PCT/US06/38448; Date of mailing: Nov. 26, 2007.
PCT International Search Report of International Application No. PCT/US06/38448; Date of mailing of the International Search Report: Nov. 26, 2007.
PCT Written Opinion of the International Searching Authority of International Application No. PCT/US06/38448; Date of mailing: Nov. 26, 2007.

* cited by examiner

*Primary Examiner*—Devon Kramer
*Assistant Examiner*—Patrick Hamo
(74) *Attorney, Agent, or Firm*—Ira Lee Zebrak

(57)   ABSTRACT

The present invention is an apparatus and method for controlling a process flow rate and a pressure in a vacuum process chamber that is evacuated by a turbomolecular pump. A throttle valve between the pump and the process chamber is controlled to regulate the pressure and flow rate. A backing valve downstream of the pump is also controlled to maintain the setting of the throttle valve within a preferred, stable operating range.

4 Claims, 5 Drawing Sheets

WIDE RANGE PRESSURE CONTROL USING TURBO PUMP

FIELD OF THE INVENTION

The present invention relates generally to the field of vacuum pumping, and more particularly, to a method and apparatus for providing and precisely controlling high vacuum at varying flow rates and pressures.

BACKGROUND OF THE INVENTION

Certain research and manufacturing processes require the use of a process chamber with high vacuum. The vacuum may be required for any of a number of reasons. In some instances, atmospheric components that could cause a chemical reaction or physical damage during a process must be removed (e.g., in vacuum melting of reactive metals such as titanium). In other instances, vacuum is used to disturb an equilibrium condition existing at normal room conditions, such as in removing volatile liquid or occluded or dissolved gas from the bulk of material (e.g., degassing oils, freeze-drying) or in desorbing gas from surfaces (e.g., the cleanup of microwave tubes during manufacture). Vacuum is also used in processes where the distance must be extended that a particle will travel before it collides with another, thereby permitting the particles to follow a collision-free course between source and target (e.g., in vacuum coating, particle accelerators, television picture tubes). Finally, vacuum is used in preparing clean surfaces, by reducing the number of molecular impacts per second. That decreases the chances of contamination (e.g., in clean-surface studies and preparation of pure, thin films).

In semiconductor wafer processing, vacuum is used during thin-film chemical vapor deposition (CVD) and etching operations, primarily to reduce contamination and to maximize particle trajectories. The vacuum system of the invention, while described herein primarily in connection with a semiconductor wafer manufacturing operation, may be used in other processes and in research activities requiring any of the above uses of vacuum.

Plasma-based semiconductor manufacturing equipment such as a dry etcher typically operates in the 2-250 mTorr pressure range with a carefully controlled vacuum. As shown in the exemplary system 100 of FIG. 1, a process chamber 110 is evacuated by a turbomolecular pump 130. Pressure in the process chamber 110 is typically measured using one or more capacitance manometer instruments 112. The chamber pressure is controlled by feeding manometer measurements into a tool controller 115 that controls and sequences the overall process. The tool controller 115 commands a valve controller 125 that drives a stepper motor on a vane or pendulum-type throttle valve 120 placed between the chamber 110 and the turbomolecular pump 130. Changing the size of the opening of the throttle valve 120 changes the pressure in the chamber 110.

A gas flow rate is set by setting a mass flow control 105 to maintain a constant flow rate through the chamber. The mass flow control maintains a constant mass flow rate as the chamber pressure is adjusted using the throttle valve 120. As used herein, the term "pumping speed" refers to a volumetric gas flow through the pump. That gas flow may be measured, for example, in standard cubic centimeters per minute (SCCM).

Recently, semiconductor processing requirements have forced tool manufacturers to install larger turbomolecular pumps to achieve lower pressures with high gas flows. The required gas flows may sometimes be as high as 1000 SCCM. Additionally, a requirement has arisen for high pressure, low flow conditions in the processing chamber, for process steps such as a breakthrough etch, in-situ photoresist strip or chamber clean.

Throttle valve technology is usually based on a stepper motor actuator having a fixed number of positions that it can assume. For example, a pendulum gate valve is commonly used as a throttle valve in the art. The pendulum gate valve has a pendulum plate that is rotated into and out of sealing position by a servo motor having a finite angular position resolution.

In order to maintain stable pressure control at lower pressures, the valve may be operated in the 20-80% open range. A graphical view of the flow characteristics of a theoretical gate valve is shown in FIG. 2, where a plot 230 represents flow rate 210 as a function valve opening percentage 220. It can be seen that in the 20-80% open range 240, the plot 230 does not have an excessively small or large slope, permitting stable control.

The example system shown is optimized for low pressure, high flow steps in a semiconductor processing recipe where the throttle valve operates close to open to maximize conductance but not so open as to limit control stability.

At higher pressure, high flow conditions the throttle valve is almost completely closed to limit the conductance of gas to the turbomolecular pump. In that region the resolution of pressure control becomes limited, one step of the stepper motor results in a big shift in the conductance and control stability is thereby compromised.

For example, as shown in FIG. 2, to maintain higher pressures in the chamber, the valve must be operated in the 0-20% open range 260. In that region, however, a very small change in valve opening yields a very large change in flow rate, causing instability in the pressure control. That limits the ability to control at higher pressures and lower flows when the valve is throttling a large turbomolecular pump with a large diameter inlet port.

The use of low pressure, high flow and high pressure, low flow steps in the same recipe also presents a significant stability problem for hardware engineers.

The problem has been addressed in several ways, with only limited success. For example, inert gas has been added to the process gas flow to add gas load to the pump. That technique works relatively quickly, and does indeed increase the process chamber pressure without requiring the operation of the throttle valve outside its preferred operating range. The technique, however, significantly increases gas consumption and cost of ownership and may produce unwanted process effects.

The rotational speed of the turbo pump rotor has been varied to adjust process chamber pressure. That technique also produces the desired change in effective pumping speed, but requires significant time to decelerate and accelerate the rotor between high pressure and low pressure steps in the processing recipe. The rotational speed change often takes more than 60 seconds, and presents an unacceptable penalty to productivity.

The backing pump rotational speed has been varied to change process chamber pressure. A backing pump is commonly used downstream of a primary turbomolecular pump to reduce the exhaust pressure of the primary pump. Changing the rotational speed of the backing pump changes the pressure drop across the primary pump, changing the process chamber pressure. That technique also requires excessive time to change the process chamber pressure. Additionally, it requires that the backing pump be located at an exact and consistent distance from the turbo pump for chamber-to-chamber repeatability.

Another approach is to use a more expensive throttle valve having a servo motor with more steps. That solution, however, is undesirable due to the significant cost penalty.

The use of exhaust port throttle valves and other forms of backing pressure control to control the inlet pressure of a turbo pump has been attempted. Each of those cases has focused on the replacement of the inlet throttling gate valve with some arrangement for regulating backing pressure.

There is therefore presently a need to provide a vacuum exhaust apparatus and method that may be used in the higher pressure, lower flow processes that are appearing in the manufacture of semiconductor wafers. Particularly, the technique should be more responsive, and implemented with a lower cost and lower maintenance requirements than those techniques currently used. To the inventors' knowledge, there is currently no such technique available.

SUMMARY OF THE INVENTION

The present invention addresses the needs described above by providing an apparatus for exhausting gas from an exhaust port of a vacuum chamber to maintain a process pressure in the chamber. The apparatus includes a pressure sensor for measuring pressure in the vacuum chamber, a throttle valve in communication with the exhaust port of the vacuum chamber for regulating flow from the exhaust port, a high-vacuum pump having a pump inlet and a backing port, the pump inlet communicating with the throttle valve, a backing valve in communication with the pump backing port for regulating flow from the backing port, and at least one controller for regulating opening sizes of the throttle valve and the backing valve based on a measurement from the pressure sensor, to maintain the process pressure in the chamber.

The controller may include a processor having an input from the pressure sensor for receiving the pressure measurement, and outputs to the backing valve and throttle valve for sending opening size regulation signals.

The controller may comprise a tool controller connected to the pressure sensor for sequencing the process chamber through at least one process flow rate and process pressure, a throttle valve controller connected to the throttle valve for controlling an opening of the throttle valve, a backing valve controller connected to the backing valve for controlling an opening of the backing valve, and a processor in communication with the tool controller, the throttle valve controller and the backing valve controller. The processor has storage media for storing computer readable instructions executable by the processor for regulating opening sizes of the throttle valve and the backing valve based on a measurement from the pressure sensor, to maintain the at least one process flow rate and process pressure in the chamber.

The pressure sensor may be a capacitance manometer. The backing valve may be a butterfly valve, pendulum gate valve or other restricted orifice device.

The throttle valve may be a pendulum gate valve. The throttle valve may further include a stepping motor positioning device.

The throttle valve may be controllable to a finite number of discrete opening sizes. In that case, the controller is further for regulating the opening size of the backing valve to achieve a process pressure in the chamber that is between those process pressures resulting from two adjacent discrete throttle valve opening sizes.

The process pressure in the chamber may be maintained without changing a rotational speed of the turbomolecular pump.

Another embodiment of the invention is method for controlling a process pressure in a vacuum chamber by regulating exhaust gas flowing from an exhaust port of the vacuum chamber and through a turbomolecular pump. The method includes the steps of reading a pressure in the vacuum chamber, controlling an opening of a throttle valve to regulate flow from the exhaust port to the turbomolecular pump based at least in part on the pressure reading, the throttle valve opening having a preferred operating range, and controlling a backing valve downstream of the turbomolecular pump to maintain the throttle valve opening within the preferred operating range.

The method may also include the step of reading computer executable instructions from a storage media, the instructions being for performing at least a portion of the method.

The step of reading the pressure may include reading a signal received from a capacitance manometer. The step of controlling the backing valve may include rotating a butterfly valve. The step of controlling the opening of the throttle valve may include advancing and retracting a pendulum gate valve.

The step of controlling the opening of the throttle valve may include actuating a stepping motor positioning device. The throttle valve may be controllable to a finite number of discrete opening sizes, in which case the step of controlling the backing valve comprises regulating the opening size of the backing valve to achieve a process pressure in the chamber that is between those process pressures resulting from two adjacent discrete throttle valve opening sizes.

The process pressure in the chamber may be controlled without changing a rotational speed of the turbomolecular pump.

Another embodiment of the invention is a method for exhausting gas from an exhaust port of a vacuum chamber and through a turbomolecular pump, to maintain a process pressure in the chamber. The method includes the steps of measuring a pressure in the vacuum chamber, regulating an opening size of a throttle valve in communication between the exhaust port of the vacuum chamber and the turbomolecular pump, and regulating an opening size of a backing valve in communication with a backing port of the pump for regulating a compression ratio of the pump. The opening sizes of the throttle valve and the backing valve maintain the process pressure in the chamber.

The throttle valve may be controllable to a finite number of discrete opening sizes, in which case the step of regulating the backing valve further comprises regulating the opening size of the backing valve to achieve a process pressure in the chamber that is between those process pressures resulting from two adjacent discrete throttle valve opening sizes.

DESCRIPTION OF THE INVENTION

The present invention is a system and method for dynamically adjusting the effective pumping speed of a large turbomolecular pump that is used in combination with a throttling gate valve between the turbo pump and a process chamber. The system and method allow a wide range of stable pressure control.

The invention will be described with respect to one embodiment in which a process chamber for processing semiconductors is evacuated. One skilled in the art will recognize that the system may be used in other applications requiring high vacuum, such as research instruments.

The invention utilizes the compression properties of turbomolecular pumps to dynamically adjust the pumping speed at the inlet port of the pump. The compression ratio of a turbo pump is usually such that as the backing pressure changes, the inlet pressure remains constant. However, above a certain backing pressure (that is determined by the turbo pump rotor design) a change in the backing pressure will result in a change in the inlet pressure.

By adding a simple, coarse control valve such as a butterfly valve to the backing port of the turbo pump and providing a controller with appropriate pressure control algorithms, one can dynamically reduce the effective pumping speed of the pump, allowing the inlet throttle valve to open in the preferred 20-80% open range, while improving pressure resolution and control.

Figure 1:
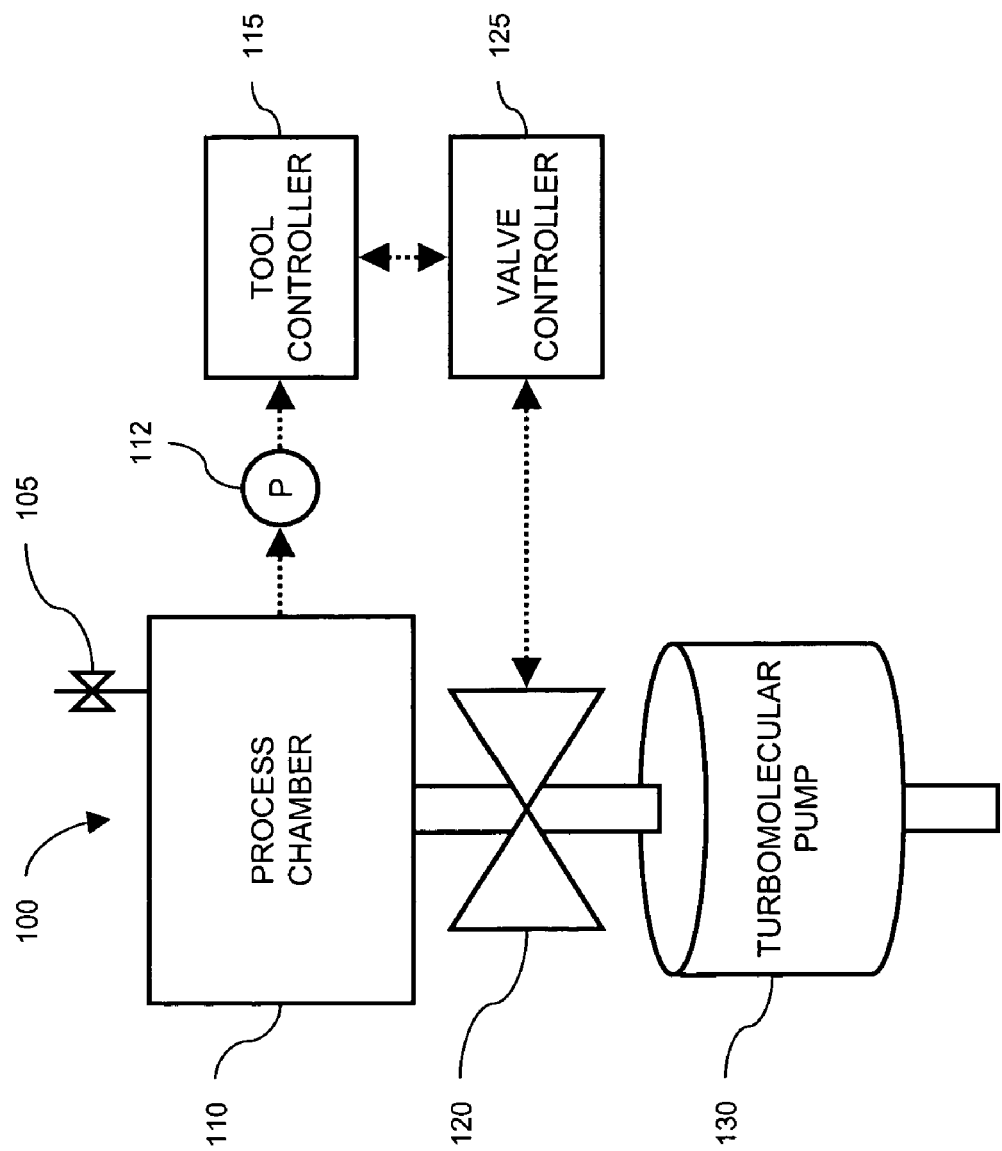
FIG. 1 is a schematic diagram showing the functional elements of a prior art vacuum exhaust apparatus.
Figure 2:
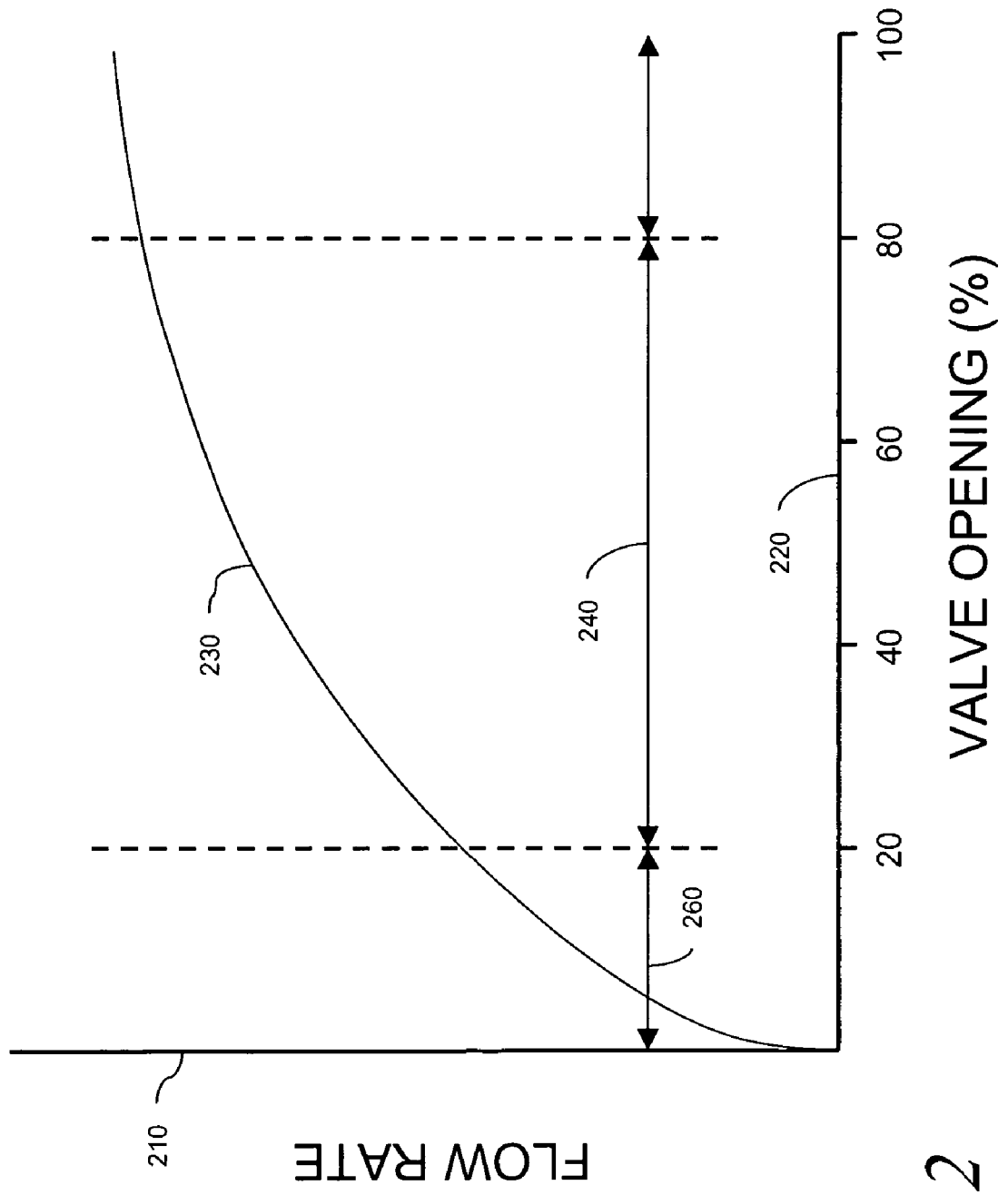
FIG. 2 is a graph of valve opening versus flow rate for a theoretical gate valve.
Figure 3:
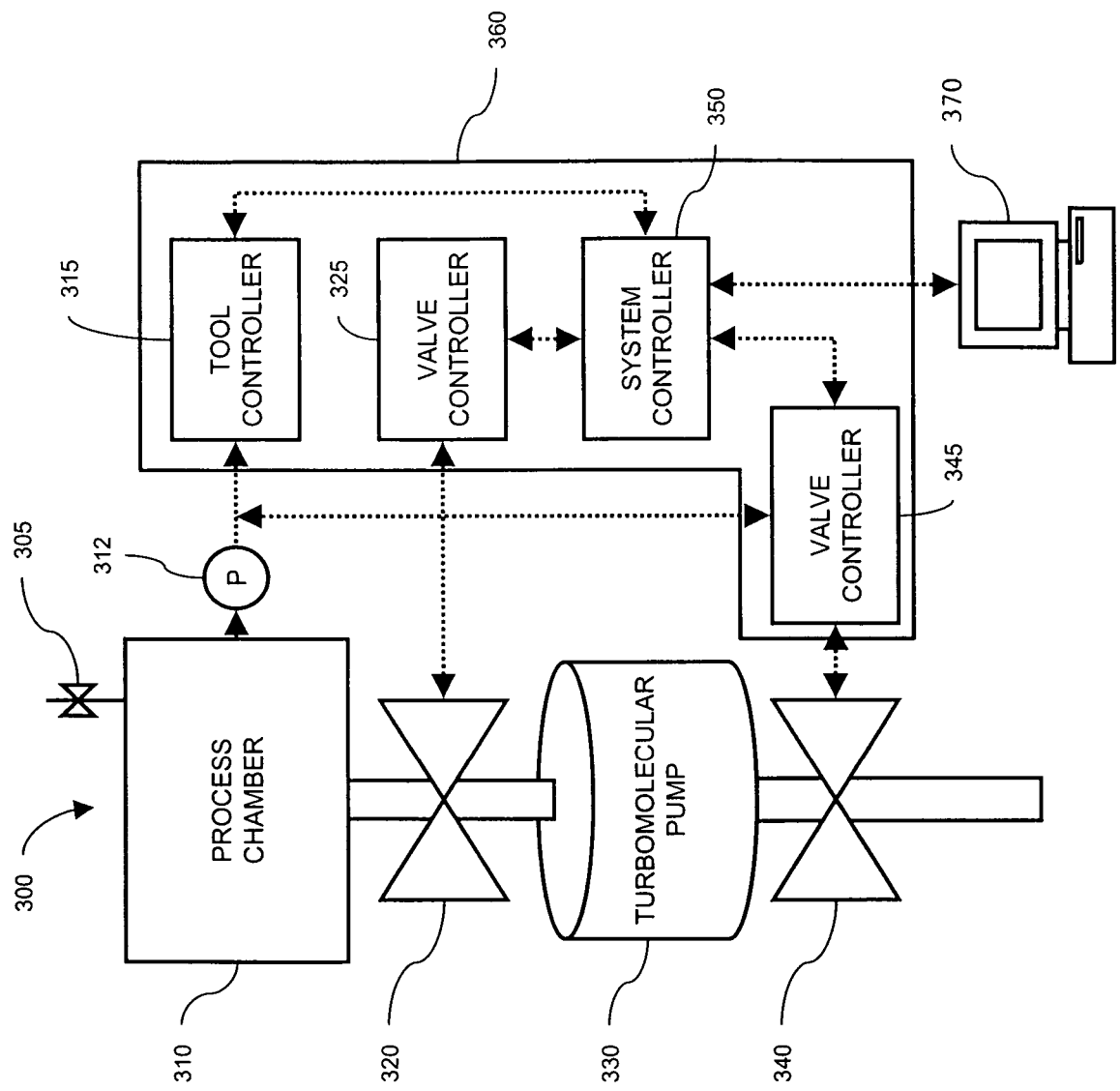
FIG. 3 is a schematic diagram showing the functional elements of a vacuum exhaust apparatus according to the present invention.

An exemplary embodiment 300 of the system of the invention is shown in FIG. 3. In that embodiment, a process gas is introduced through a mass flow control 305 into a process gas chamber 310. A throttle valve 320 is provided between the process chamber 310 and a turbomolecular pump 330. The throttle valve 320 may, for example, be a Series 65.0 pendulum pressure control valve with integrated controller, manufactured by VAT Vakuumventile AG of Haag, Switzerland. One skilled in the art will recognize that other types of throttle valves, such as traditional gate valves, may be used.

The valve is controlled by a valve controller 325. While the controller 325 of FIG. 3 is shown separately from the valve 320, the controller 325 may instead be integrated with the valve 320 in a single, compact package.

The throttle valve 320 may utilize a stepping motor for positioning the pendulum plate, as discussed above. One of the advantages of the present invention is that a standard throttle valve with a stepping servo motor positioning device may be used, without the disadvantages caused by the positioning resolution near the extremes of travel of the valve.

On the backing side of the turbomolecular pump 330 is a backing valve 340 of the invention. The backing valve 340 may be a low-cost, coarse resolution butterfly valve. For example, in one embodiment of the invention, the backing valve is a type 153 exhaust throttle valve manufactured by MKS Instruments, Inc. of Wilmington, Mass. One skilled in the art will recognize that other types of control valves may be used as the backing valve of the invention.

A controller 345 controls positioning of the backing valve 340. That controller may be stand-alone or integral. The positioning servo for the backing valve need not be a stepping motor as is used in the throttle valve, but may instead be a lower-cost, coarser positioning device.

A tool controller 315 is connected to receive a signal from the pressure transducer 312, which may be a capacitance manometer. The tool controller further coordinates the process steps to be completed in the process chamber.

A system controller 350 may be an embedded PC running system control software such as a cut-down version of CPC control software available from ASC Process Systems of Sylmar, Calif. The system controller 350 is connected for receiving information from the tool controller 315 including the actual and desired process chamber pressures. The system controller is also connected to the throttle valve controller 325 and the backing valve controller 345, and instructs those controllers to open or close their respective valves according to pressure control algorithms stored in the system controller, which interpret signals from the tool controller 315.

The tool controller 315, valve controller 325, system controller 350 and valve controller 345 comprise an overall controller 360 for regulating opening sizes of the throttle valve and the backing valve based on a measurement from the pressure sensor. While the individual controllers are shown separately in FIG. 3, it should be noted that any two or more of those controllers may be integrated into a single controller for controlling the system of the invention.

A diagnostic workstation 370 may be provided to program the controller elements of the system, and to change those programs to implement new process recipes, etc.

Figure 4:
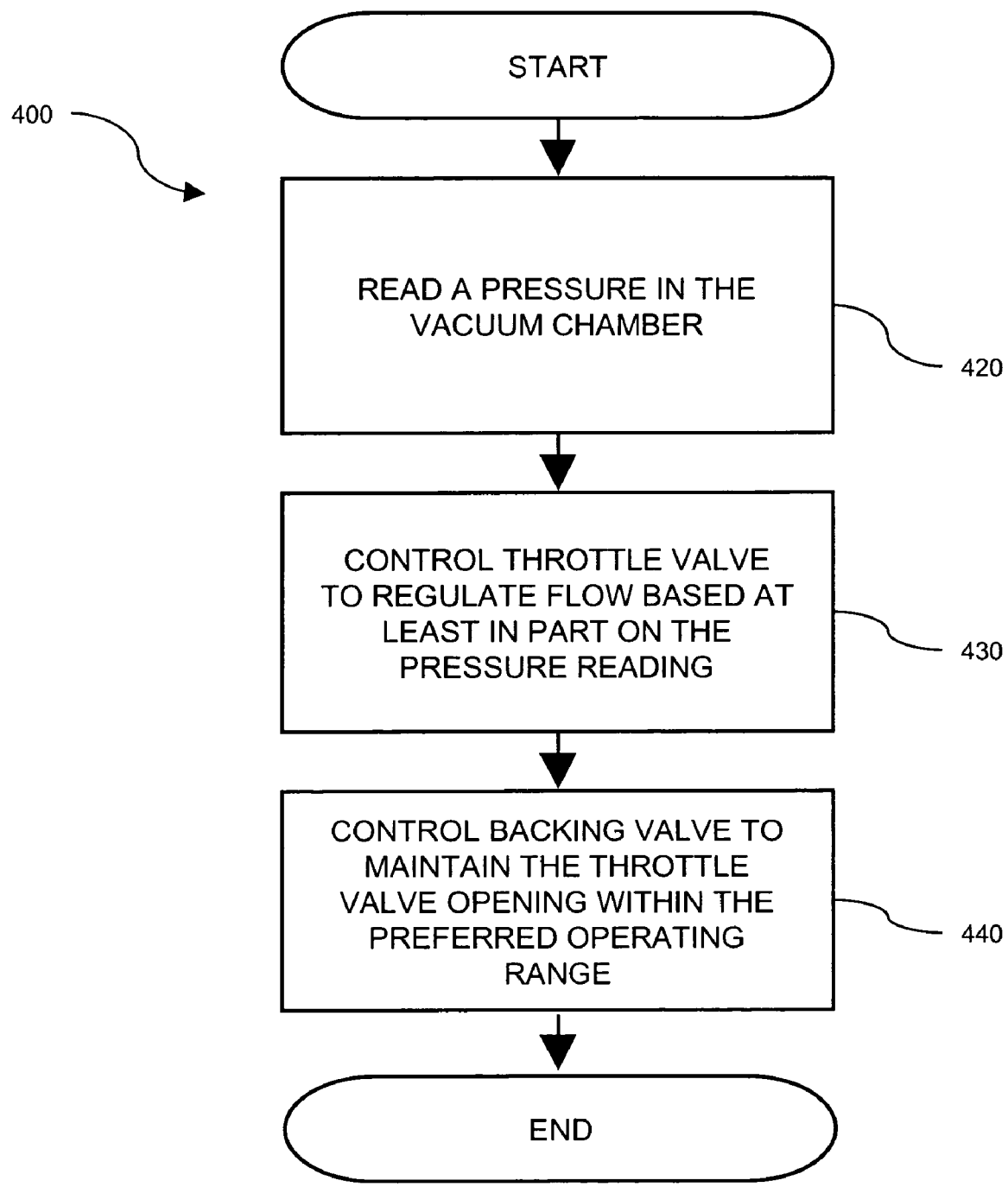
FIG. 4 is a block diagram showing a method according to one embodiment of the invention.

A method 400 for controlling a process pressure in a vacuum chamber according to the invention is shown in FIG. 4. The pressure is controlled by regulating exhaust gas flowing from an exhaust port of the vacuum chamber and through a turbomolecular pump. Initially, a pressure is read (step 420) in the vacuum chamber. Next, an opening of a throttle valve is controlled (step 430) to regulate flow from the exhaust port to the turbomolecular pump. The control is based at least in part on the pressure reading. The throttle valve opening has a preferred operating range.

A backing valve downstream of the turbomolecular pump is controlled (Step 440) to maintain the throttle valve opening within the preferred operating range.

Figure 5:
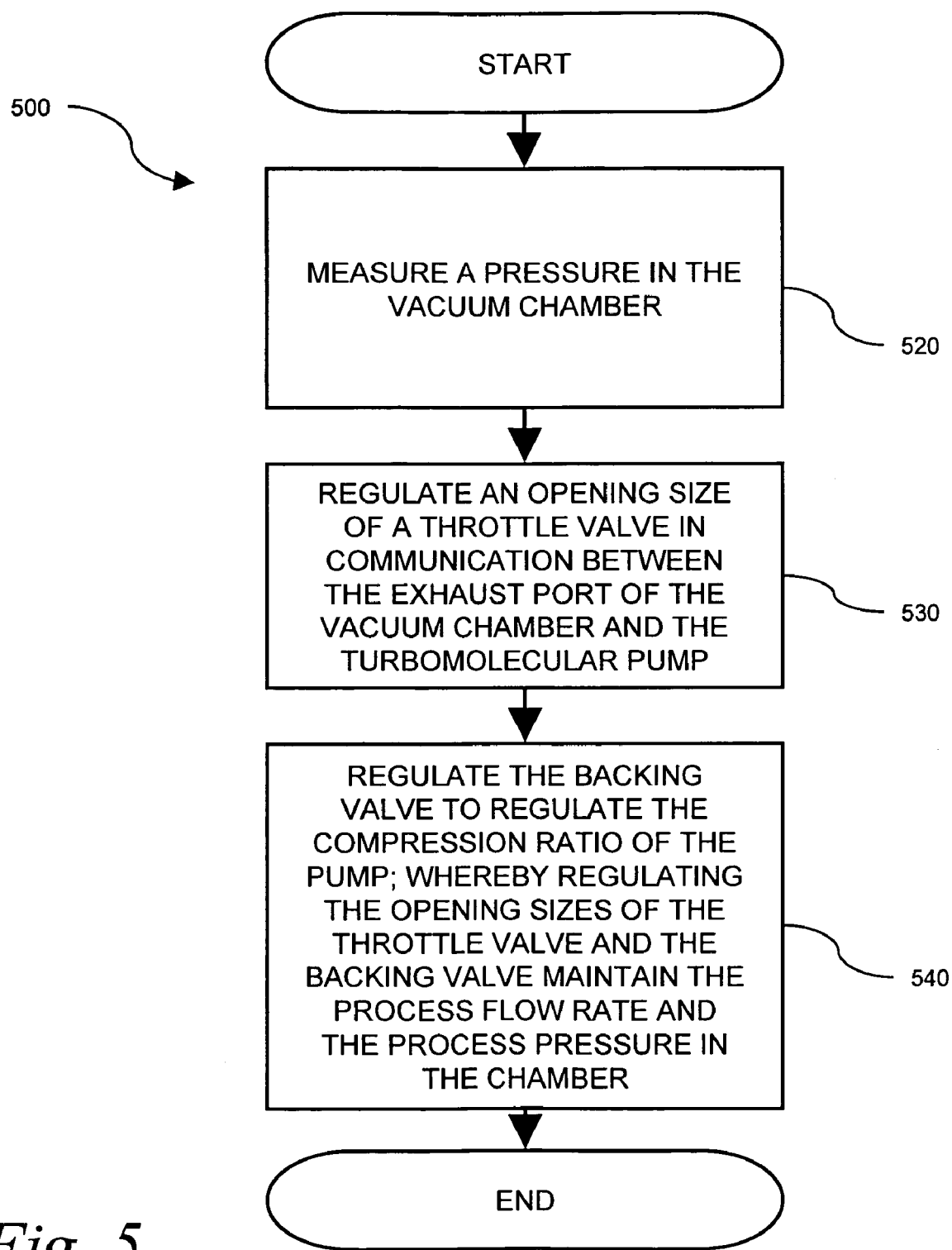
FIG. 5 is a block diagram showing a method according to another embodiment of the invention.

Another embodiment 500 of the method of the invention is shown in FIG. 5. That method is for exhausting gas from an exhaust port of a vacuum chamber and through a turbomolecular pump, to maintain a process flow rate and a process pressure in the chamber. The method begins by measuring (step 520) a pressure in the vacuum chamber. An opening size of a throttle valve in communication between the exhaust port of the vacuum chamber and the turbomolecular pump is regulated (step 530). An opening size of a backing valve in communication with a backing port of the pump for regulating a compression ratio of the pump is also regulated (step 540). Regulating the opening sizes of the throttle valve and the backing valve maintain the process pressure in the chamber.

The foregoing Detailed Description is to be understood as being in every respect illustrative and exemplary, but not restrictive, and the scope of the invention disclosed herein is not to be determined from the Description of the Invention, but rather from the Claims as interpreted according to the full breadth permitted by the patent laws. For example, while the system is described as controlling pressure and flow in a semiconductor processing chamber, it may alternatively be used in conjunction with any system requiring high vacuum. It is to be understood that the embodiments shown and described herein are only illustrative of the principles of the present invention and that various modifications may be implemented by those skilled in the art without departing from the scope and spirit of the invention.

What is claimed is:

1. An apparatus for exhausting gas from an exhaust port of a vacuum chamber to maintain a process pressure in the chamber, comprising:

a pressure sensor for measuring pressure in the vacuum chamber;

a throttle valve in communication with the exhaust port of the vacuum chamber for regulating flow from the exhaust port;

a high-vacuum pump having a pump inlet and a backing port, the pump inlet communicating with the throttle valve;

a backing valve in communication with the pump backing port for regulating flow from the backing port;

at least one controller for regulating opening sizes of the throttle valve and the backing valve based on a measurement from the pressure sensor, to maintain the process pressure in the chamber; wherein the at least one controller comprises:

a tool controller connected to the pressure sensor for sequencing the process chamber through at least one process flow rate and process pressure;

a throttle valve controller connected to the throttle valve for controlling an opening of the throttle valve;

a backing valve controller connected to the backing valve for controlling an opening of the backing valve; and a processor in communication with the tool controller, the throttle valve controller and the backing valve controller, the processor having storage media for storing computer readable instructions executable by the processor for regulating opening sizes of the throttle valve and the backing valve based on a measurement from the pressure sensor, to maintain the at least one process flow rate and process pressure in the chamber.

2. An apparatus for exhausting gas from an exhaust port of a vacuum chamber to maintain a process pressure in the chamber, comprising:

a pressure sensor for measuring pressure in the vacuum chamber;

a throttle valve in communication with the exhaust port of the vacuum chamber for regulating flow from the exhaust port;

a high-vacuum pump having a pump inlet and a backing port, the pump inlet communicating with the throttle valve;

a backing valve in communication with the pump backing port for regulating flow from the backing port;

at least one controller for regulating opening sizes of the throttle valve and the backing valve based on a measurement from the pressure sensor, to maintain the process pressure in the chamber;

wherein the throttle valve is controllable to a finite number of discrete opening sizes, and wherein the controller is further for regulating the opening size of the backing valve to achieve a process pressure in the chamber that is between those process pressures resulting from two adjacent discrete throttle valve opening sizes.

3. A method for controlling a process pressure in a vacuum chamber by regulating exhaust gas flowing from an exhaust port of the vacuum chamber and through a turbomolecular pump, the method comprising the steps of:

reading a pressure in the vacuum chamber;

controlling an opening of a throttle valve to regulate flow from the exhaust port to the turbomolecular pump based at least in part on the pressure reading, the throttle valve opening having a preferred operating range;

controlling a backing valve downstream of the turbomolecular pump to maintain the throttle valve opening within the preferred operating range; and wherein the throttle valve is controllable to a finite number of discrete opening sizes, and wherein the step of controlling the backing valve comprises regulating the opening size of the backing valve to achieve a process pressure in the chamber that is between those process pressures resulting from two adjacent discrete throttle valve opening sizes.

4. A method for exhausting gas from an exhaust port of a vacuum chamber and through a turbomolecular pump, to maintain a process pressure in the chamber, the method comprising the steps of:

measuring a pressure in the vacuum chamber;

regulating an opening size of a throttle valve in communication between the exhaust port of the vacuum chamber and the turbomolecular pump and wherein the throttle valve is controllable to a finite number of discrete opening sizes;

regulating an opening size of a backing valve in communication with a backing port of the pump for regulating a compression ratio of the pump;

whereby regulating the opening sizes of the throttle valve and the backing valve maintain the process pressure in the chamber; and wherein the step of regulating the backing valve further comprises regulating the opening size of the backing valve to achieve a process pressure in the chamber that is between those process pressures resulting from two adjacent discrete throttle valve opening sizes.

* * * * *